(12) United States Patent
Bao et al.

(10) Patent No.: US 6,555,411 B1
(45) Date of Patent: Apr. 29, 2003

(54) THIN FILM TRANSISTORS

(75) Inventors: Zhenan Bao, Jersey City, NJ (US); Edwin Arthur Chandross, Murray Hill, NJ (US); John A. Rodgers, New Providence, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 10/024,831

(22) Filed: Dec. 18, 2001

(51) Int. Cl.[7] .................. H01L 5/40; H01L 21/00; H01L 21/336; H01L 21/8238
(52) U.S. Cl. .......... 438/99; 438/197; 438/158; 438/199
(58) Field of Search ................ 438/99, 158, 166, 438/197, 199, 200, 201

(56) References Cited

U.S. PATENT DOCUMENTS

| | | | |
|---|---|---|---|
| 5,953,595 A | * | 9/1999 | Gosain et al. .............. 438/158 |
| 6,284,562 B1 | * | 9/2001 | Batlogg et al. ............... 438/99 |
| 6,285,055 B1 | * | 9/2001 | Gosain et al. .............. 438/260 |
| 6,312,304 B1 | * | 11/2001 | Duthaler et al. ............ 313/506 |
| 6,335,539 B1 | * | 1/2002 | Dimitrakopoulos et al. .. 438/99 |
| 6,344,660 B1 | * | 2/2002 | Dimitrakopoulos et al. 257/289 |
| 6,376,290 B1 | * | 4/2002 | Gosain et al. .............. 438/166 |

* cited by examiner

Primary Examiner—Richard Booth
Assistant Examiner—Walter L. Lindsay, Jr.
(74) Attorney, Agent, or Firm—Peter D. Wilde

(57) ABSTRACT

The specification describes thin film transistor (TFT) devices with source/drain contacts made by a metallo organic deposition (MOD) method wherein a metallo organic compound/metal particulate mixture is deposited to form a base pattern, and the base pattern is then plated with gold. The porous, relatively high resistance base pattern is thereby converted to a corrosion resistant, low resistance contact. The plating covers the sidewalls of the base pattern, thus allowing the final channel length to be less than the minimum design rule used for depositing the base pattern.

19 Claims, 9 Drawing Sheets

THIN FILM TRANSISTORS

FIELD OF THE INVENTION

This invention relates to improvements in thin film transistors (TFTs), and more particularly to improvements in TFT devices with organic semiconductors.

BACKGROUND OF THE INVENTION

Over the last decade, IC technologies have been proposed that use organic semiconductor thin film transistors (TFTs). The chief attractions of such circuits stem from the anticipated ease of processing and compatibility with flexible substrates. These advantages are expected to translate into a low-cost IC technology suitable for applications such as smart cards, electronic tags, and displays.

TFT devices are described in F. Garnier et al., Science, Vol. 265, pp. 1684–1686; H. Koezuka et al., Applied Physics Letters, Vol. 62 (15), pp. 1794–1796; H. Fuchigami et al., Applied Physics Letters, Vol. 63 (10), pp. 1372–1374; G. Horowitz et al., J. Applied Physics, Vol. 70(1), pp. 469–475; and G. Horowitz et al., Synthetic Metals, Vol. 42–43, pp. 1127–1130. The devices described in these references are based on polymers or oligomers as the active materials, in contrast with the amorphous silicon and polysilicon TFT structures that were developed earlier. The devices are typically field effect transistors (FETs). Polymer active devices have significant advantages over semiconductor TFTs in terms of simplicity of processing and resultant low cost. They are also compatible with polymer substrates used widely for interconnect substrates. Polymer TFTs are potentially flexible, and polymer TFT ICs can be formed directly on flexible printed circuit boards. They also have compatible coefficients of thermal expansion so that solder bonds, conductive expoxy bonds, and other interconnections experience less strain than with semiconductor IC/polymer interconnect substrate combinations. While metal-insulator-semiconductor (MIS) FET devices are most likely to find widespread commercial applications, TFT devices that utilize both p-type and n-type organic active materials are also known. See e.g., U.S. Pat. No. 5,315,129. S. Miyauchi et al., Synthetic Metals, 41–43 (1991), pp. 1155–1158, disclose a junction FET that comprises a layer of p-type polythiophene on n-type silicon.

Recent advances in polymer based TFT devices are described in U.S. Pat. No. 5,596,208, issued May 10, 1996, U.S. Pat. No. 5,625,199, issued Apr. 29, 1997, and U.S. Pat. No. 5,574,291, issued Nov. 12, 1996. With the development of both n-type and p-type active polymer materials, as described in these patents, complementary ICs can be readily implemented, as detailed particularly in U.S. Pat. No. 5,625,199.

A prominent advantage of these TFT devices is low cost, and efforts continue to further reduce cost. Forming conductor patterns in transistor structures by conventional techniques has long been recognized as a relatively high cost operation. The conventional techniques are typically subtractive techniques, i.e. they involve depositing a blanket conductive layer, forming a mask on the conductive layer, and "subtracting" unwanted portions of the layer. The alternative, additive processing, is inherently more efficient, involving depositing or "adding" material only where it is desired. The drawback to additive processing for microcircuits is that very fine lines are difficult to produce. A primary motive for making very fine features in semiconductor technology is to reduce device cost. Since TFT device technology already offers low cost, somewhat larger features may be tolerated. This is especially the case if the cost of TFr devices can be reduced further using additive processing.

Among the common additive approaches are screen printing, stencil printing, contact ink printing, and non-contact printing (e.g. ink-jet printing). These techniques use various forms of metal powders, and employ a variety of patterning methods using masks and patterned applicators. A more recently developed approach uses metal powders with metal organic decomposition (MOD) materials. In a preferred MOD process, the pattern is formed electrographically, e.g. by electrostatic printing, where the "mask" is created electrically. A variety of electrostatic or electrographic methods are known in the art. Many of these use photoconductive layers with either a positive or negative electrostatic image formed using light to create charge in the image pattern desired or to discharge a blanket charged layer in the image pattern. This approach is attractive for simplicity, and also because the method does not require a 1 to 1 mask or pattern, as many additive processes require. In this description, techniques of this variety will be referred to generically as electrographic printing.

A wide variety of materials can be used with electrographic printing. The likely candidates for forming conductive lines in IC technology are the commonly used IC metals, Al, Cu, and Au, and compound conductors such as TiN. These base conductors can be converted to vehicles for electrographic printing in a variety of ways. Proposals typically involve making fine powders of conductive material. In electrographic technology, these are referred to as toners.

Mixtures of fine metal powders and organic compounds which decompose on heating have been developed recently for IC applications. This technology, which is sometimes referred to as MOD (for Metal Organo Decomposition) technology, has proven attractive for microcircuit fabrication. The basic method is described and claimed in U.S. Pat. No. 5,882,722 issued Mar. 16, 1999; and U.S. Pat. No. 6,036,889, issued Mar. 14, 2000. Methods for preparing suitable toners of these materials for use in electrographic printing are described in U.S. Pat. No. 6,153,348, issued Nov. 28, 2000. The electrographic method has been proposed specifically for use in making TFT devices. See U.S. Pat. No. 6,274,412, issued Aug. 14, 2001. Each of these patents is incorporated herein by reference for relevant details of MOD technology.

The primary conductor material described in these patents is silver. Silver has always been an attractive candidate for electrical device applications because of its very low electrical resistivity. However, silver is one of the best electromigrating materials known, which means that in the presence of electrical fields, it physically diffuses uncontrollably, causing serious problems in a microcircuit environment. Silver also corrodes relatively easily.

A similar situation prevails for copper conductors. Copper also has very low resistivity, but is not used with gold since Au—Cu is an unstable metallurgical system.

A drawback to MOD technology in general is that the conductors are deposited in a porous state. The curing process results in a degree of densification, but the final product has typically at least twice the bulk resistivity of the conductor. Moreover, the porous MOD deposited conductor is susceptible to corrosion, as well as electromigration. In addition, relatively high conversion temperatures (typically greater than 120 C.) are required to achieve reasonably high conductivity, which is not compatible with plastic substrates.

Another drawback to MOD technology, identified in general earlier, is the limitation on the feature size that the electrographic technique is capable of forming. Lines of tens of microns in width, with equivalent spacing, can be produced, and such features sizes are suitable for many elements in TFT technology. However, the most critical dimension for TFT devices is the source/drain spacing. This spacing determines the channel length that, for high frequency performance, is advantageously minimized.

SUMMARY OF THE INVENTION

The foregoing problems in forming TFT conductors using MOD technology have been largely overcome by the method of this invention. According to one embodiment of the invention silver source and drain base patterns are made using the MOD technique. After cure, the silver base patterns are plated with gold using an electroless plating process. In the context of MOD technology, the gold overlayer produces several advantages. Due to the porosity of the MOD deposited material, the electroless plating solution penetrates the silver base pattern and essentially eliminates the porosity and results in smoother electrode surface. Since gold has a resistivity even lower than that of silver, the resulting structure exhibits significantly improved conductivity over the relatively high resistance of porous silver made using MOD techniques. The gold overlayer also cures the problem of corrosion that occurs with a bare silver conductor. Finally, the gold overlayer may be used to effectively reduce the source/drain separation so that the channel length can be reduced and adjusted according to the thickness of the gold plating.

Copper base layers may also be used. In this case contact between copper and gold must be avoided. Therefore, a nickel barrier layer is deposited prior to deposition of the gold layer.

DETAILED DESCRIPTION

Figure 1:
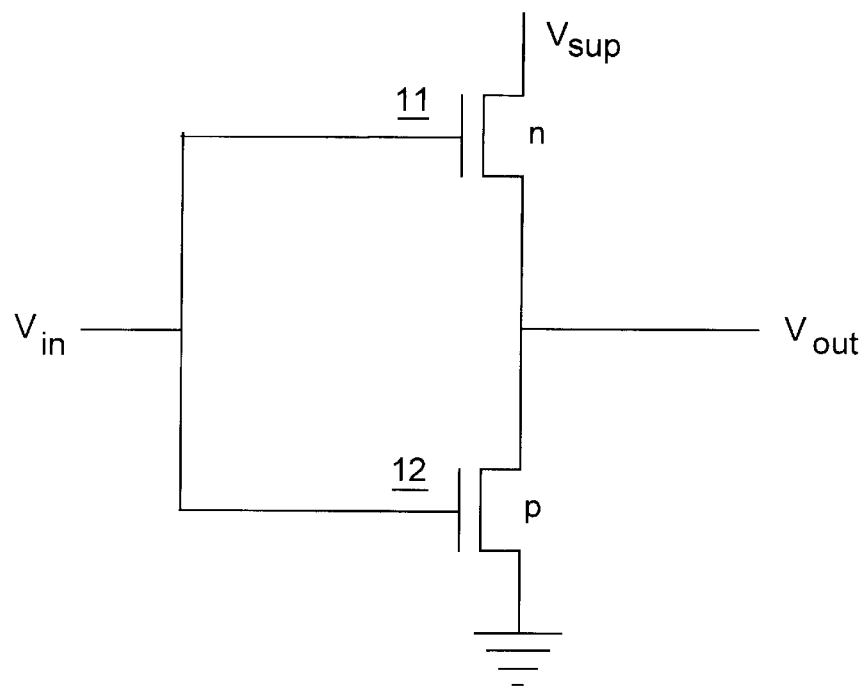
FIG. 1 is a schematic circuit diagram for a simple inverter using a CMOS pair of TFT devices fabricated in accordance with the invention.

A processing sequence for making TFT CMOS devices with the source/drain electrodes of the invention is described as follows in conjunction with FIGS. 1–19. The device used for illustration is a CMOS pair for the simple inverter circuit of in FIG. 1, where n-channel TFT is designated 11 and p-channel TFT is designated 12. The p-channel transistor may be used as driver for the n-channel load.

The TFT device structure used for the process illustration is the upside-down configuration that is described and claimed in U.S. patent application Ser. No. 09/137,920 filed Aug. 20, 1998, which is incorporated herein by reference. This TFT structure offers several advantages. It can be made with simple processing. The deposition of the semiconductor layer occurs late in the process thus avoiding hostile process conditions such as etchants, cleaning agents, high temperature, etc. Importantly, the upside down structure, as described here, has inherent electrical isolation between devices in a CMOS pair as well as between pairs. Moreover, the structure allows interconnection layers to be formed prior to transistor formation, which feature has important advantages in some technologies. In the context of this invention it offers an important additional advantage. Since the source/drain electrodes, produced by the MOD deposition technique, require heating to consolidate the porous as-deposited metal, the source and drain electrodes are preferably formed prior to deposition of the semiconductor. Alternatively, the transistor can have the source/drain electrodes prepared by MOD followed by deposition of semiconductor, dielectric layer, and finally the gate electrode. The preferred method is to prepare the gate/dielectric/semiconductor layers on a second polymer substrate and use lamination to assemble the two parts together.

Figure 2:
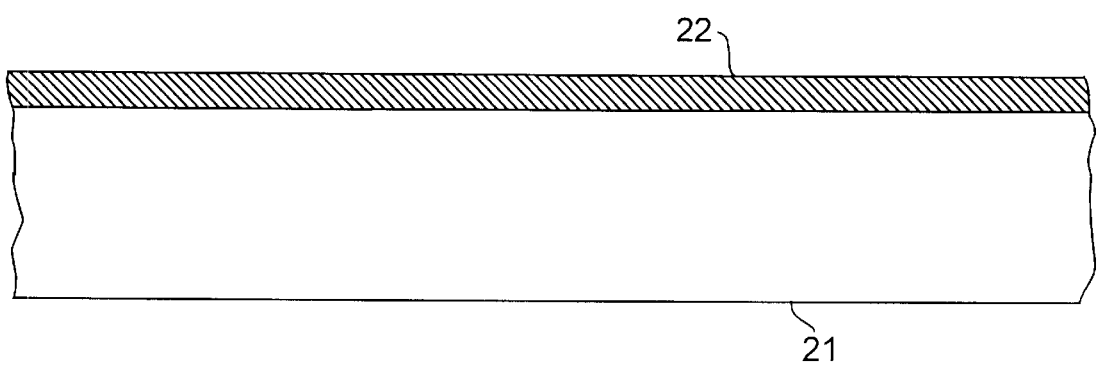
FIGS. 2–19 are schematic representations of process steps useful for forming the organic semiconductor TFT CMOS inverter circuit of FIG. 1.

Referring to FIG. 2, a portion of an IC substrate is shown at 21. A single TFT CMOS pair will be illustrated for simplicity, but it will be understood that the single pair of devices is representative of a large integrated array of devices. Also, the features shown in the figures herein are not to scale. Substrate 21 is an insulating material such as ceramic, glass, or a polymer. It may be rigid or flexible, and it may comprise a standard printed circuit substrate of glass reinforced epoxy, or polyimide. Alternatively it may be silicon on which an insulating layer of $SiO_2$ is grown or deposited. The first level metal is shown at 22. In this inverted structure this level is referred to as the first level because it is formed first but, as will be appreciated by those skilled in the art, it corresponds to the second or third level metal in traditional structures. The metal may be any of a variety of conductive materials. The common choice in standard IC technology is aluminum. However, due to the nature of the structures described here the choice of conductive material can be made from a larger universe than is usually considered, including the standard materials, i.e. aluminum, TiPdAu, TiPtAu, $TaN_x$, $TiN_x$, Au, Ni, etc., as well as non-traditional choices most notably copper, and conductive polymers such as polyaniline and metal-containing polymer inks. The use of polymer conductors may be favored in applications where a degree of flexibility is desired. The choice of deposition technique is wide since the structures at this stage in the processing, as contrasted with traditional IC processing at this stage, have no thermally sensitive components. Thus this deposition step, as well as subsequent deposition and etching steps used for forming the two level or multi-level metallization interconnections, may involve significant substrate heating if that is otherwise convenient and cost effective. Accordingly, the metal layer can be evaporated, or sputtered. The thickness of the metal layer can vary widely, but will typically be in the range 0.05 to 2 ?m.

Figure 3:
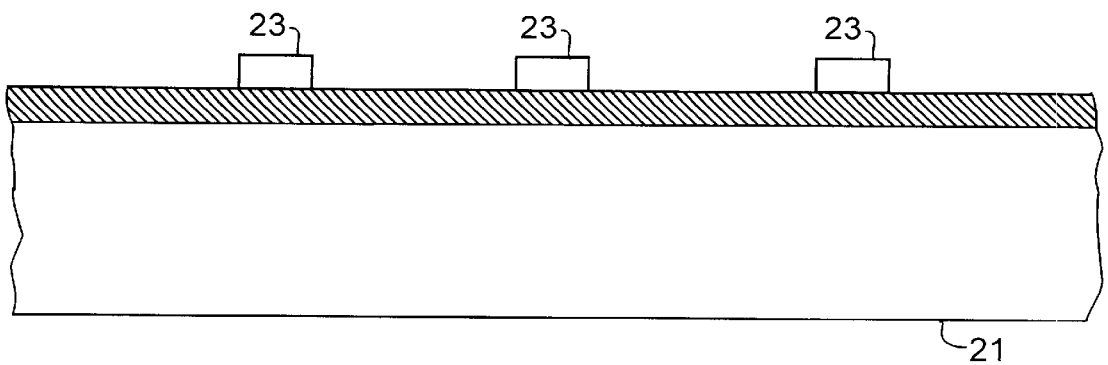
Figure 4:
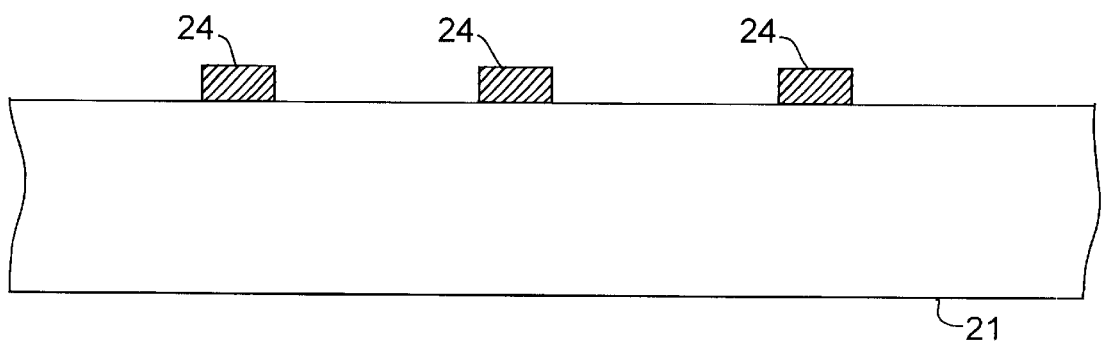

The next step, represented by FIG. 3, is to pattern the first level of metallization using a lithographic mask 23. The mask is typically made by photolithography, but may also be formed using other forms of lithography. Other masking steps, to be described below, may also utilize these alternative lithography technologies. The first metal layer is then patterned by standard etching, e.g. plasma or RIE etching, to produce the pattern of metal runners 24, as shown in FIG. 4.

With a wide choice of conductive materials available, it may be useful, in applications where the interconnect density is not large, to print the circuit directly, using screen printing, stenciling, ink jet printing, or a similar technique.

Figure 5:
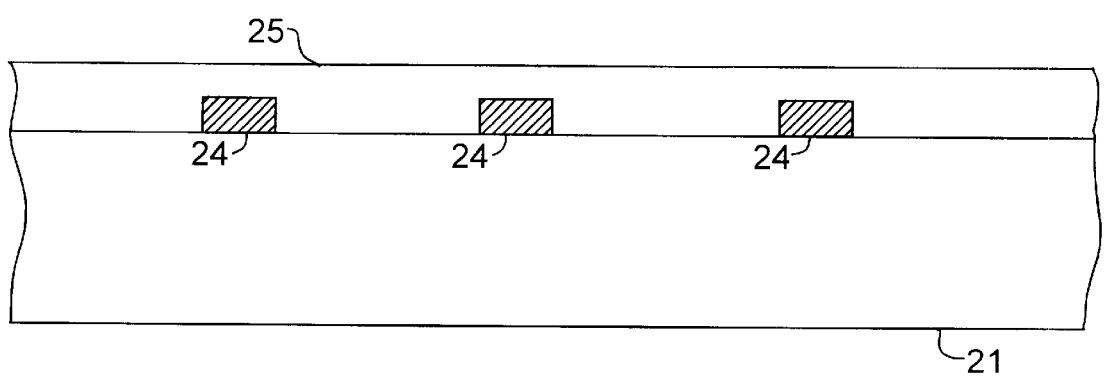

With reference to FIG. 5, the first interlevel dielectric 25 is formed over the first level metal pattern as shown. The interlevel dielectrics in the structures according to the invention may be chosen from a variety of insulating materials such as spin on glass (SOG), or $Si_3N_4$ or $SiO_2$ deposited by CVD for example. In the TFT structures described here, it is expected that the use of polymer materials wherever they can be effective will be desirable, both from the standpoint of processing simplicity and cost, and also to produce IC structures that tolerate strain, i.e. are somewhat flexible. Accordingly, for such applications the use of polyimide or similar organic polymer insulating material is recommended. A suitable material is a polyimide supplied by Nissan Chemical Company under the designation RN-812. This material can easily be deposited in layers with 0.1–1 ?m thickness, which have desirable insulating properties. The application technique for organic insulators is typically spin coating or solution casting. Some inorganic insulators, notably spin-on-glass, also share the property of convenient application. In some applications, e.g. where fine pattern dimensions are not required, the dielectric layer may be applied as a patterned layer, already containing the interlevel windows.

Figure 6:
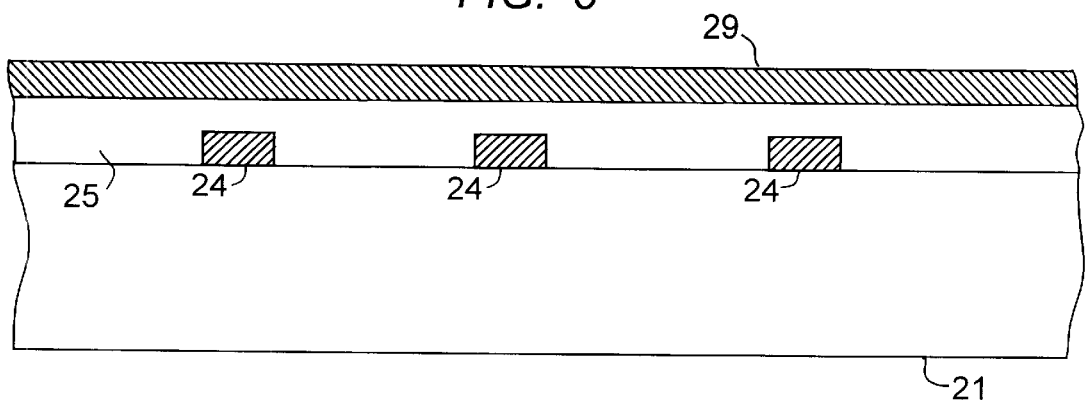
Figure 7:
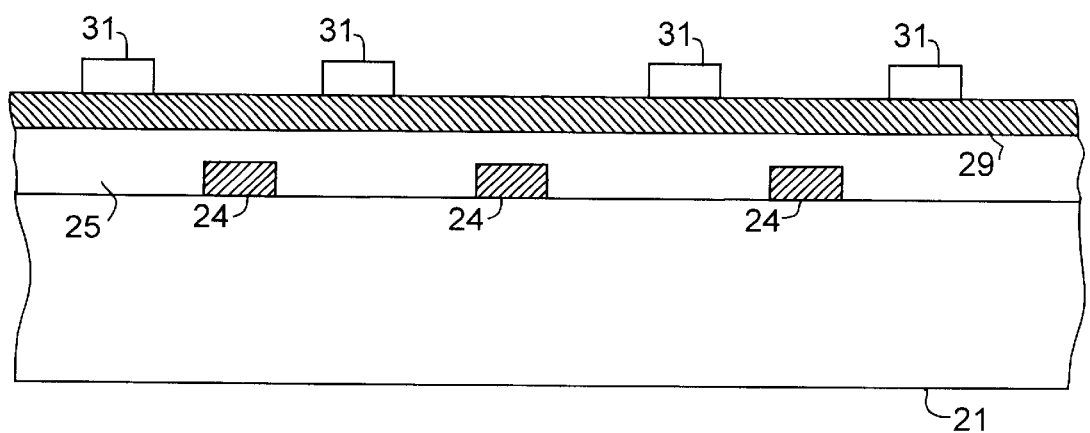
Figure 8:
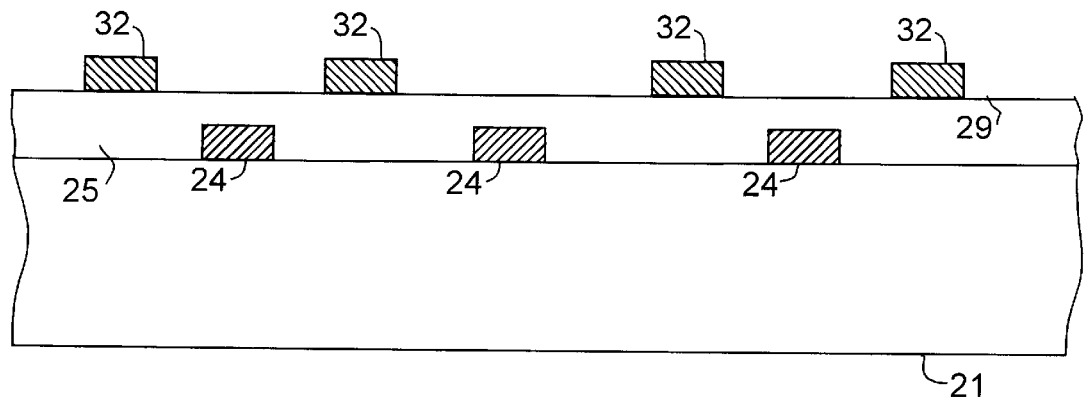

The second level metal, 29, is deposited over the first interlevel dielectric 25 as shown in FIG. 6. The second level metal may be the same as, or may be different from, the first level metal. The second level metal is patterned in a manner similar to the first level using mask 31 to form runners 32 as shown in FIGS. 7 and 8.

Figure 9:
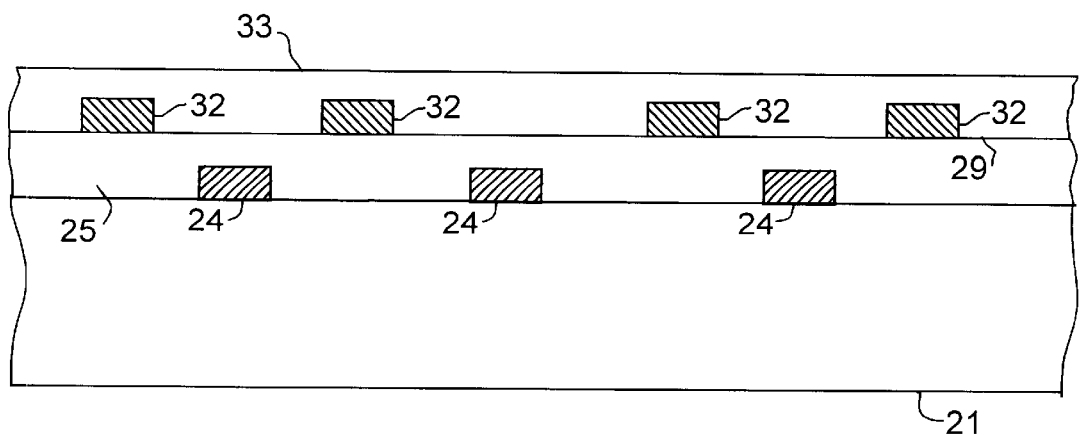
Figure 10:
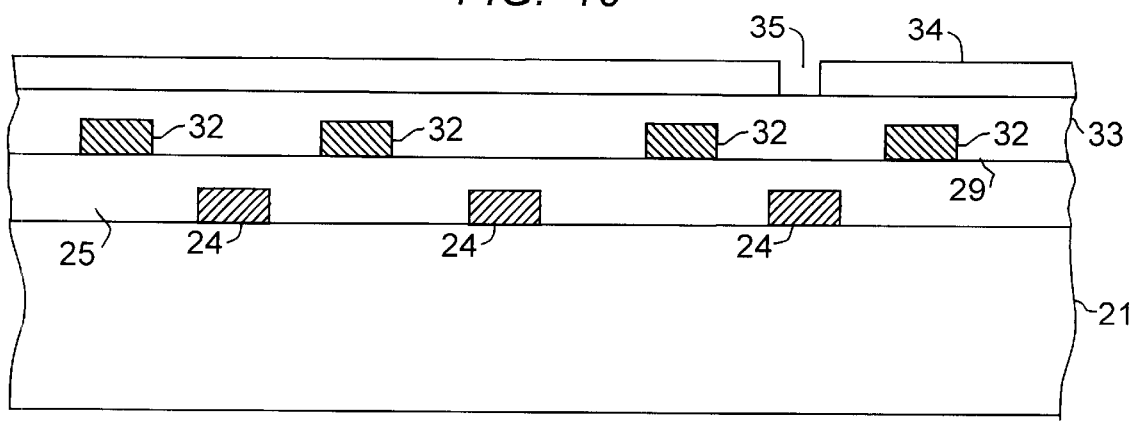
Figure 11:
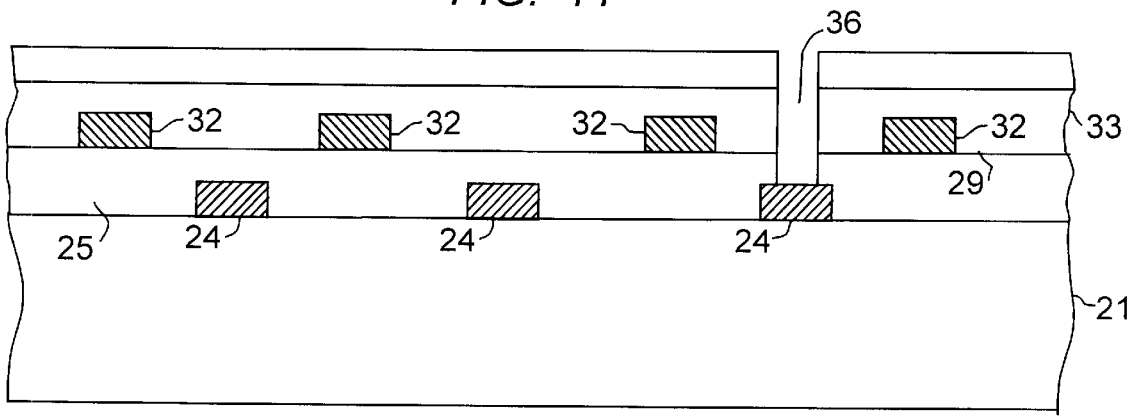

The next step forms the second interlevel dielectric 33 as shown in FIG. 9. This layer may be formed in a manner similar to layer 25. Interlevel dielectric 33 is provided with through holes or windows for interlevel interconnections between the first level (24) and the gate level to be formed next. The interlevel dielectric is masked with patterned mask 34 as shown in FIG. 10, and the portion of dielectric layer 33 exposed by the opening 35 in the resist is etched to form a window to interconnect the first and gate levels. The mask opening is aligned to metal runner 24 in the first level interconnection pattern. A single interlevel interconnection is shown for simplicity, but a typical IC will have many such interlevel interconnections. These interlevel interconnections are standard, and techniques for forming the interlevel windows are well known. For example, if the dielectric layer is $SiO_2$ the windows may be formed by plasma etching or RIE. The resulting structure is shown in FIG. 11, with interlevel window 36 formed in the dielectric layers 25 and 33. Alternatively, interlevel windows or vias can be made directly using a photodefinable polymer dielectric such as polyimide, or, if polymer material is used for the interlevel dielectric, the vias can be made using laser processing.

The gate level metal, usually the first level metal in a traditional structure, and usually of polysilicon, is formed late in the sequence of the invention, and may comprise a wide variety of metals. The usual requirement that the gate level metal be relatively refractory to withstand the conventional implantation drive steps is eliminated in the process of the invention, so the gate material can be selected from many materials, even aluminum or copper. However, the art has extensive experience with silicon gates insulated with grown $SiO_2$. Tantalum gates covered with TaN or TiN may also be convenient. Conducting polymers are also suitable for the gate metal and are especially compatible with other elements in the structures described here. Gold and indium tin oxide (ITO) are also useful gate electrode materials.

Figure 12:
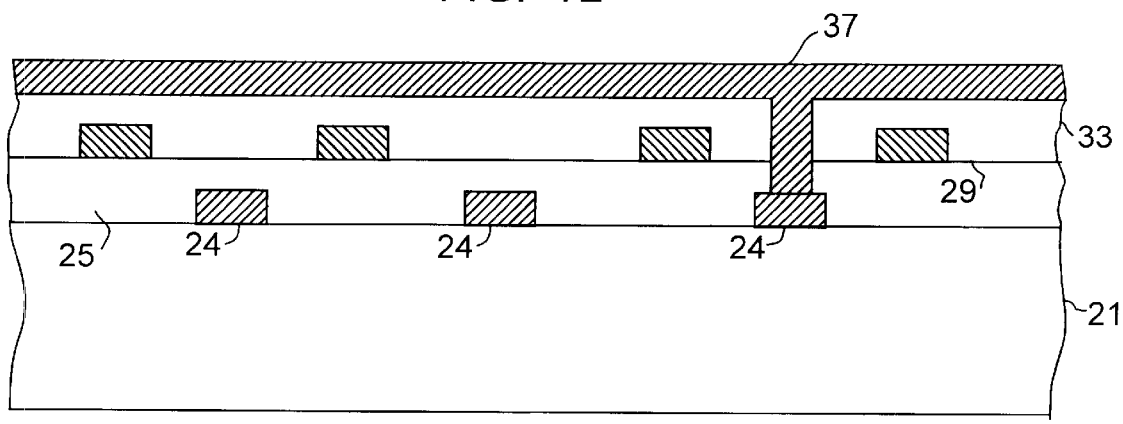
Figure 13:
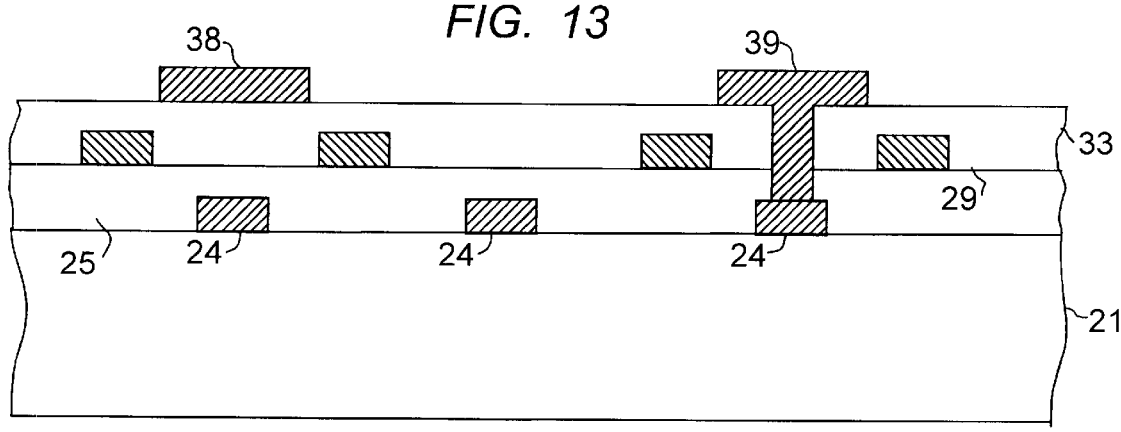

The gate metal layer 37 is shown in FIG. 12 deposited over the second interlevel dielectric layer 33and into the windows that will interconnect selected gates to the first level metal. The gate metal layer is then patterned (FIG. 13) by lithography to form gate structures 38 and 39. Gate 38 is interconnected on the gate level and gate 39 is interconnected, in this illustrative arrangement, to runner 24 x. regioregular poly(thiophene)s.on the first level. For simplicity, the metal is shown deposited into the window as a part of the gate metal deposition step. As known by those skilled in the art, interlevel plug technologies can be used for forming the interlevel interconnections.

Figure 14:
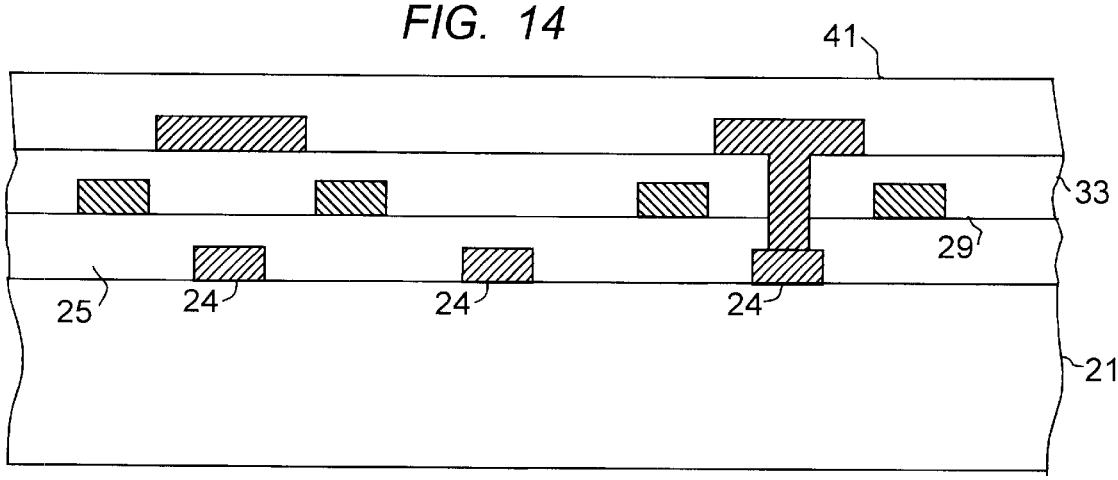

The gate dielectric 41 is then formed over the structure as shown in FIG. 14. The gate dielectric may be of a conventional oxide or nitride, or combination thereof such as 200 nm $Si_3N_4$ and 100 nm $SiO_2$, or may be $Al_2O_3$ deposited by r-f magnetron sputtering. The gate dielectric may also be SOG or an organic insulator such as polyimide that can be formed conveniently by spin-on techniques. An example of such a material that has been used successfully in this application is pre-imidized polyimide, supplied by Nissan Chemical Company under the designation SE-1180. This material can be spun on at 4000 RPM and cured at 120° C. for 2 hours to produce a coating with a thickness of 70 nm. If desired, the gate material may be polysilicon, and the gate dielectric grown as a surface layer over the polysilicon in which case the gate dielectric layer 41 would not cover the entire second interlevel dielectric as it appears in FIG. 14.

Figure 15:
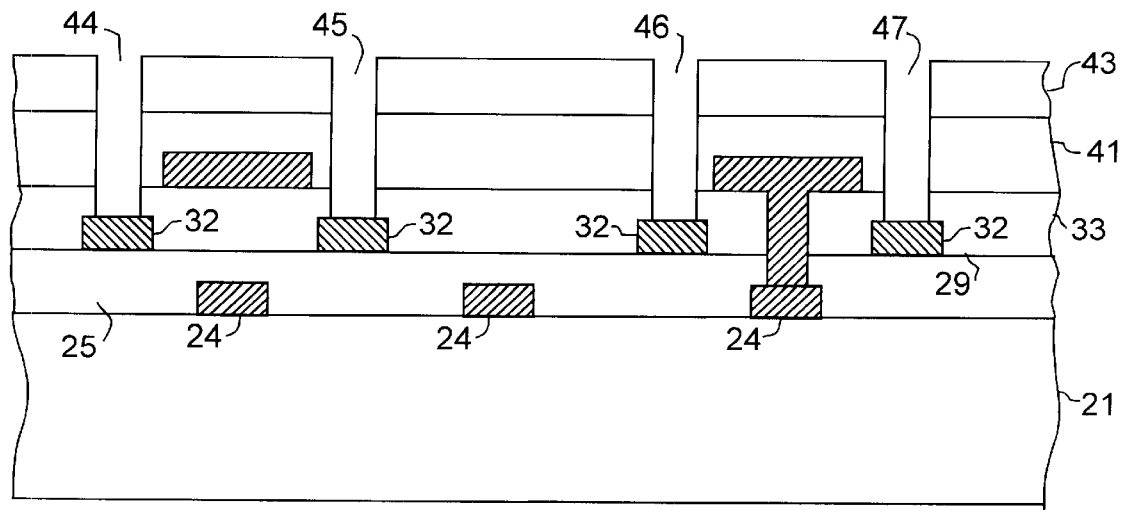

The gate dielectric is masked with patterned mask 43 as shown in FIG. 15, and the portion of gate dielectric layer 41 and the underlying portion of dielectric layer 33 exposed by the openings 44, 45, 46, and 47 in the resist, is etched to form a window to interconnect the source drain contacts to the second metal level. The mask openings are aligned to metal runners 32 in the second level interconnection pattern.

Figure 16:
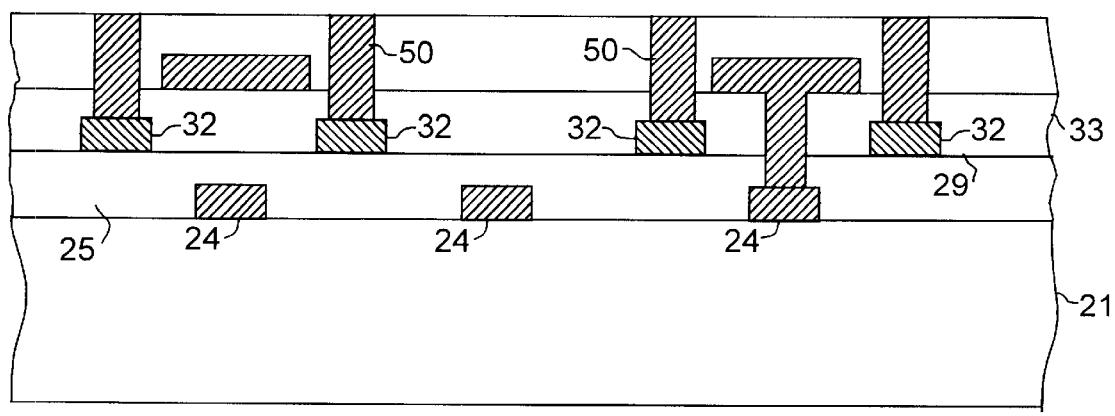
Figure 17:
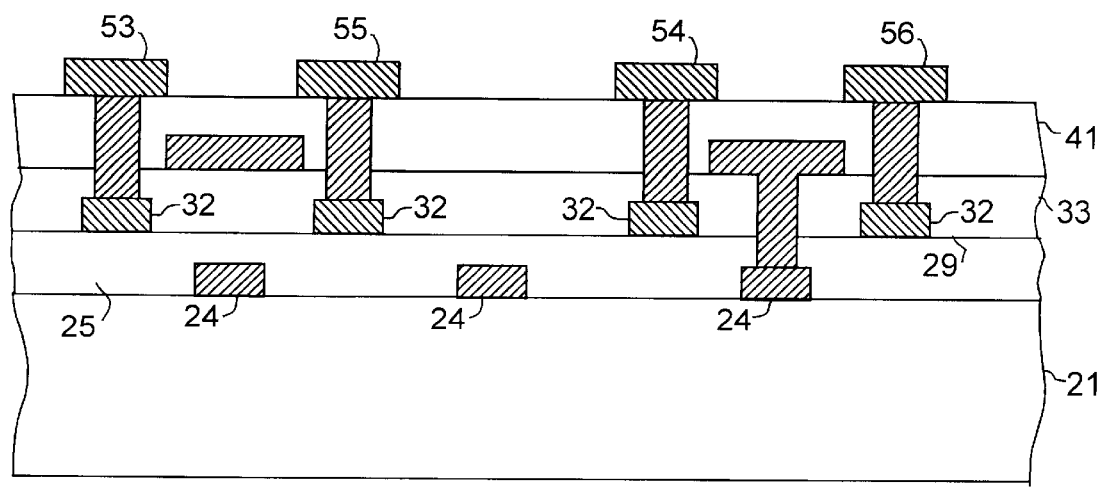

The interlevel plugs 50 are then deposited in the interlevel windows as shown in FIG. 16, making contact to the second level runners 32. The plugs may be formed with the source/drain contact deposition but the aspect ratio as it appears in this figure suggests separate formation of the plugs. The source electrodes 53, 54 and the drain electrodes 55, 56, are formed as shown in FIG. 17. As is well known, the position of the source and drain electrodes should be adjacent to the gate electrode in the vertical plane, or should overlap slightly the edge of the gate electrode. The formation of the source and drain contacts according to the invention will be described more fully below.

Figure 18:
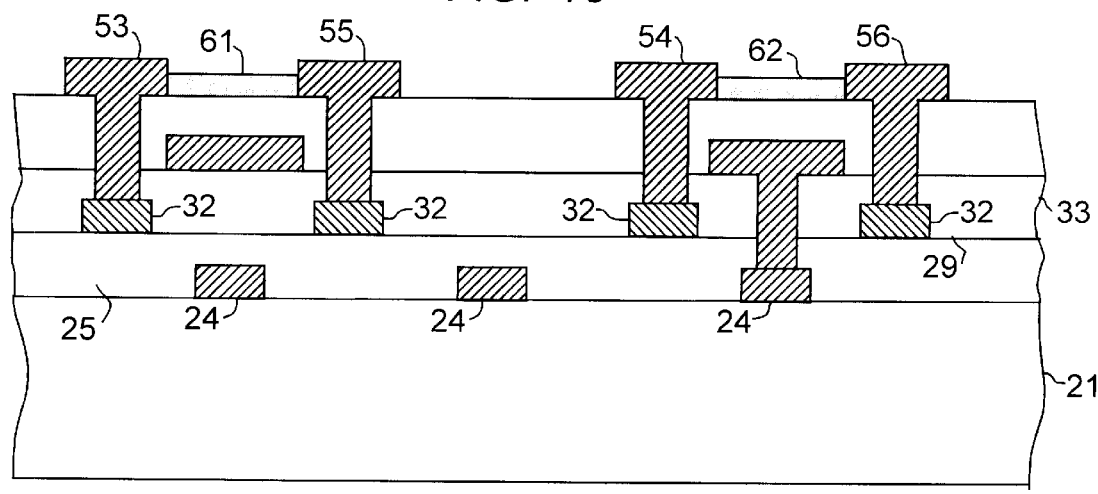

One of the last steps in the process of the invention, which is the first step in the traditional FET process, is illustrated in FIG. 18 and is the formation of the active semiconductor bodies 61, 62 in which the field effect is realized, and in which the FET channel extends between sources 53, 54 and drains 55, 56. The active material is an organic semiconductor.

A wide variety of organic semiconductors have now been developed for TFT devices. Among these are:

i. perylenetetracarboxylic dianhydride (PTCDA), the imide derivative of PTCDA;

ii. napthalenetetracarboxylic dianhydride (NTCDA);

iii. fluorinated copper pthalocyanine;

iv. ?-sexithiophene;

v. tetracene or pentacene, or end substituted derivatives thereof;

vi. oligomers of thiophene with the degree of oligomerization $\geq 4$ and $\leq 8$, linked via the 2- and 5-carbons;

vii. alternating co-oligomers of thienylene and vinylene, with thiophenes as terminal groups and 3–6 thiophene rings, linked via their 2- and 5-carbons;

viii. linear dimers and trimers of benzo[1,2-b: 4,5-b'] dithiophene;

ix. oligomers of v. and vi. with substituents (e.g., alkyl substituents with 1–20 carbons) on the 4- or 5-carbon of the end thiophenes;

Both p- and n-type materials are contained in this list and can be combined as needed for complementary ICs. In the development of this invention the material for the p-channel TFT devices was regioregular poly)3-hexylthiophene), and the material for the n-channel devices was copper hexadecafluorophthalocyanine ($F_{16}CuPc$).

Figure 19:
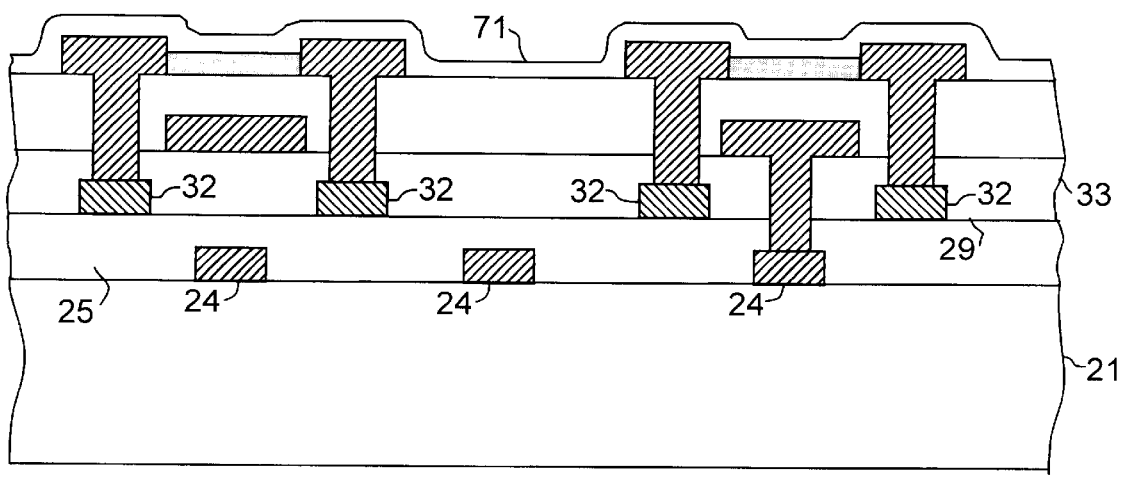

If necessary, the device can be sealed using a passivating layer 71 as shown in FIG. 19.

Figure 20:
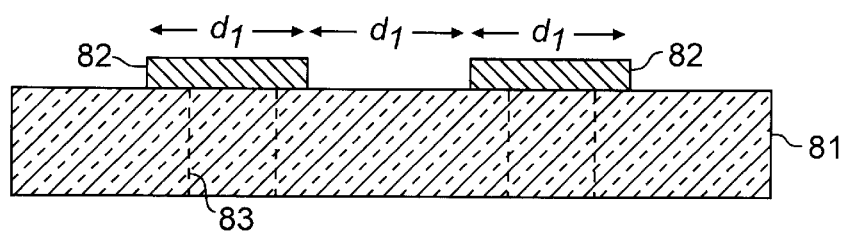
FIGS. 20–23 are views showing in more detail the multilayer source/drain contacts made according to the invention.

A device structure, with multilayer source/drain contacts according to the invention, is shown schematically in FIGS. 20–23. Substrate 81 represents the layer on which the source/drain electrodes are formed. This layer may be layer 41 in the embodiment shown in FIG. 17, and the vias are represented in FIG. 20 by dashed lines 83. This figure is also intended to represent alternative embodiments, where the substrate may be an organic polymer layer, or a glass plate, or where the gate is formed over the source drain layer, representing a more conventional MOSFET configuration. A variety of other TFT configurations will occur to those skilled in the art. Source/drain electrodes produced according to the invention are useful in any of these alternative configurations. It is preferred however, due to the heating step in the conventional MOD process, for the source/drain electrodes to be formed prior to deposition of the semiconductor layer. This favors the upside-down configurations where the gate (and interconnection layers) is (are) formed first, lamination approach, or drain-source/semiconductor/dielectric/gate.

With reference to FIG. 20, the source and drain base patterns are shown at 82, 83 respectively. The base patterns are shown with width $d_1$ for reasons to be explained below. The separation between the base patterns 82, 83 is also shown as width $d_1$.

Base patterns 82, 83 are deposited using an additive MOD process. That process is described in detail in U.S. Pat. No. 6,036,889 issued Mar. 14, 2000, which patent is incorporated by reference herein, but will be described briefly here.

The basic MOD thick film process resembles common techniques used in thick film technology, i.e. it utilizes mixed metal powders with a liquid carrier, and the mixture is applied to the substrate in the pattern desired. In MOD technology, the mixture additionally contains a metallo-organo compound and the mixture is typically cured by heating to an elevated temperature of several hundred degrees. The mixture may be applied by silk screening, stencilling, gravure, lithography, or other suitable technique known in the art. Preferably, it is applied by an electrographic method.

The mixtures may contain metal flake with a ratio of the maximum dimension to the minimum dimension of between 5 and 50 nanometers. Alternatively, the metal may be incorporated as a colloidal metal powder with particulates having a diameter of about 10 to about 40 nanometers. The concentration of the colloidal metal in the suspension may range from about to about 50% by weight.

The MOD constituent can be any compound in which a metal atom is linked to an organic moiety through a heteroatom bond weaker than the carbon-carbon bonds of the organic moiety. Examples of such MOD compounds are carboxylic acid metal soaps in which the metal atom is bonded via oxygen and which decompose readily with the evolution of carbon dioxide and hydrocarbon fragments, as well as the elemental metal. Preferably, silver neodecanoate is used as the MOD compound in the MOD mixture.

Other metals and other organic constituents such as amines can also be used as the MOD composition. A typical amine compound is gold amine 2-ethylhexanoate. Other heteroatom linkages to the metals with sulfides and phosphides can be used in the MOD component.

The MOD mixture begins to decompose at a temperature of approximately about 200° C. to promote consolidation of the metal constituents. The consolidation is typically effected at temperatures less than 450° C., and a duration less than six minutes.

The preferred electrographic process is an electrostatic process. That process is described in detail in the references cited earlier, in particular, U.S. Pat. No. 6,153,348, issued Nov. 28, 2000, but will be described below. In general, the method involves dispersing metallic particles with a metallo-organic (MO) compound to form a toner. The metal particles and the MO compound are dispersed in an electrically insulating, organic liquid such as Exxon's Isopar with the addition of a charge director to give the proper charge on the toner particles, and an appropriate conductivity to the dispersion. The dispersion forms the liquid toner which is used to develop an electrostatically produced latent image. The developed image is heated to consolidate the metal particles and produce a conductive image on the printing plate. Alternatively, it can be transferred to the device substrate by an electrostatic gap transfer method and heated to consolidation.

Examples of the MOD method for forming the base patterns 82, 83 are given below which follow the techniques given in the cited patents.

EXAMPLE I A MOD mixture is formed from the following:

| | |
|---|---|
| Silver neodecanoate | 1.10 g |
| Silver flake, (Aldrich # 32,707-7) | 0.88 g |
| Kerosene | 0.48 g |

The constituents are blended and screened onto a substrate. The samples are heated in a stationary oven for twenty minutes at a temperature of 185° C. After heating, the MOD compound decomposes leaving a well-defined and well-bonded image with a thickness of approximately 15 microns.

The electrical resistivity of the deposited silver pattern is of the order of 54 microhm cm. This value can be compared with the resistivity of bulk silver, i.e. 1.59 microhm cm. While the silver image 10 adheres well to the polymer substrate 12, the silver flake is poorly consolidated and full of holes and inclusions.

EXAMPLE II A MOD mixture is formed from the following:

| | |
|---|---|
| Silver neodecanoate | 3 g |
| Aldrich silver flake Catalog #32,707-77 | 12 g |
| alpha-terpineol | 1.8 g |

Using this mixture, conductor patterns are screened onto a substrate with a semiautomatic screen printer and heated to above 300° C. in a stationary oven as before. The electrical-resistivity of the printed and heated silver conductor is approximately 3 microhm cm, compared with the resistivity of bulk silver, i.e. 1.59 microhm cm.

Techniques for forming the base contact areas by screen printing or the like may use metal in several different forms.

However, for electrographic methods, metal in the form of a fine powder is preferred and, as mentioned above, the preferred technique for forming the base pattern is an electrographic technique. The following is an example of such a technique based on U.S. Pat. No. 6,153,348, issued Nov. 28, 2000.

EXAMPLE III

An oleate coated silver nanopowder is synthesized as follows:

Silver oxalate (doped with 1% copper for heat stabilization) (20 g) is slurried into oleic acid (250 mL) by stirring with a magnetic stir bar. The solution is then heated on a hot plate with stirring to 185° C. for 90 minutes. The solution is then allowed to cool to room temperature and the dark gray precipitate settles to the bottom. The solvent is then removed by pipette from the top of the precipitate. The remaining solvent is removed from the precipitate by washing with tetrahydrofuran (THF) while stirring the precipitate, then allowing it to settle and removing the THF by pipette from the top of the precipitate. The precipitate is then washed with Isopar H in the same manner. Finally, the wet precipitate is dispersed in Isopar H (80 g) and treated ultrasonically for 30 minutes.

The result is a dispersion of silver particles with approximately 10% Ag (wt %).

The oleate coated silver nanopowder toner is then charged by dispersing the powder in Isopar H (100 mL) with ultrasonic stirring for 30 minutes. To this dispersion was added enough Indigo Imaging Agent (IIA) to give a solution conductivity (as measured with a Scientifica 627 Conductivity Meter) of 2.7 pmho/cm.

To print the image, a grounded, photoimaged printing plate with a liquid photo resistant surface is electrostatically charged by passing a 5000 V corona over it. Liquid toner is then applied to the printing plate to develop the latent electrostatic image. The image is then washed with Isopar H to remove excess toner. The image is then allowed to dry at room temperature. The developed image is heated to 220° C. for 3 minutes to give a continuous, pure silver film. The electrical resistivity of the silver film is approximately 5 microhm cm. compared with 1.59 microhm cm. for bulk silver.

The silver base pattern is then plated with gold. Several options are available for this step. Since the base pattern is conductive and relatively active metallurgically, the displacement plating step may be performed directly on the silver base pattern. Displacement plating is preferably used for the gold plating step. Displacement plating is characterized by the absence of a reducing agent in the bath. The plating mechanism is by electro-kinetic displacement of gold for silver in the surface layer of the silver base pattern. It is facilitated by the surface porosity of the silver base pattern, producing an upper gold layer with a thickness that is essentially self-limiting, and a lower gold-Ag intermetallic layer with a thickness which grows with time. For further details relating to this process, reference is made to U.S. Pat. No. 6,136,702, issued Oct. 24, 2000, which patent is incorporated herein in its entirety.

A suitable displacement plating bath for the gold layer is 8.40% potassium aurocyanide in 36.450% ammonia, and is available from Technic, Inc. as OROMERSE N. A suitable procedure is given in the following example.

EXAMPLE IV

OMERSE N displacement gold solution is placed in a glass container. The pH of the solution is adjusted to 5.0–5.5 using ammonia, and heated to a temperature in the range 60° C.–70° C. using an immersion heater. The solution is preferably agitated while the substrates being plated are immersed. The gold layer plates at approximately 0.005–0.0075 μm/min. A layer thickness of 0.01–3.0 μm is suitable for the invention.

Figure 21:
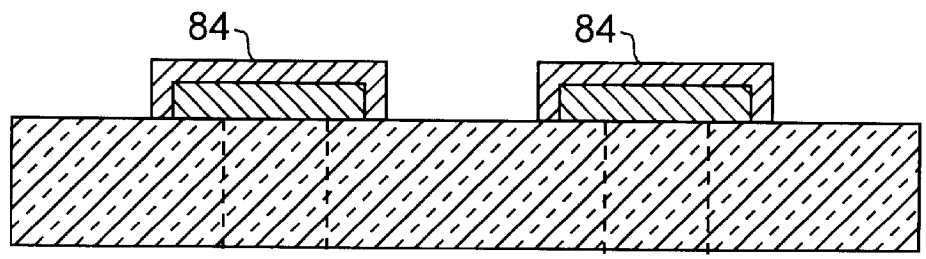
Figure 22:
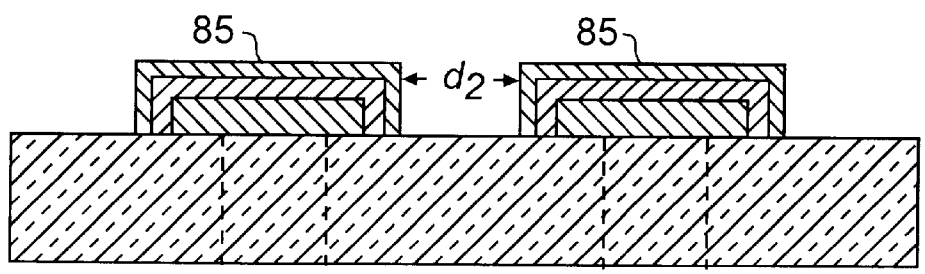

Alternatively, the silver base pattern may first be plated with nickel. An advantage of this option is that to reach a desired overall contact thickness, much of that thickness may be provided by the nickel layer, and the gold portion of the overlay may be correspondingly reduced in thickness, resulting in a cost saving. This option is represented by FIGS. 21 and 22, wherein nickel intermediate layer 84 is shown deposited over the silver base pattern in FIG. 21, and the gold overlay is shown at 85 in FIG. 22. Nickel is an effective buffer layer and provides a robust multiplayer contact as well as an effective intermediate surface for displacement plating of gold.

The following procedure is recommended.

EXAMPLE V

The nickel may be plated directly on the silver base pattern, or the base pattern may be sensitized prior to nickel plating. For the latter, a sensitizer solution is prepared by heating a 0.02N HCl solution to 50° C. and adding $PdCl_2$ (99.9%), while stirring, to produce a 6 g/L solution. The solution is filtered through a 0.2 μm nylon filter. The silver base pattern is immersed in the sensitizer solution for 5 minutes at ambient temperature, followed by rinsing in deionized water.

The activated silver base pattern is then plated by immersion of the substrate in the electroless plating solution for 30 s at 86° C.

Electroless nickel processing is well developed and widely used in industry. Deposition is typically performed in an acid phosphorus bath which produces a deposit with high conductivity, excellent uniformity, high hardness, and good adhesion to overplated materials. Electroless plating baths are characterized by the presence of a chemical reducing agent, usually alkali hypophosphite, and most commonly sodium hypophosphite, $NaH_2PO_2$. Alternative choices for reducing agents are sodium borohydride and dimethylamine-borane [$(CH_3)_2NHBH_3$] which deposits a Ni—B alloy. An effective nickel electroless plating solution, which deposits as a NiP alloy, is Type 4024 available from Fidelity Chemical Products Corp. Another effective electroless nickel plating solution which deposits as a NiP alloy is given in the following table.

TABLE 1

| | |
|---|---|
| Nickel sulfate (for $Ni^{+2}$) | 28 g/L |
| Sodium acetate (buffer) | 17 g/L |
| Sodium hypophosphite (reducing agent) | 24 g/L |
| Lead acetate (stabilizer) | 0.0015 g/L |
| pH | 4.4–4.6 |
| Temperature | 82–88° C. |

The thickness of the electroless nickel layer for this application is preferably in the range 0.2–3.0 μm.

The silver base pattern with the gold plated overlay, or optionally the nickel/gold overlay, forms the conductor for the source/drain contacts as described above. The overall thickness of the source and drain contacts will typically be in the range of 100–5000 microns.

It will be appreciated at this point that the MOD deposited base pattern is not relied on for the conductivity of the contact, i.e. the conductivity is determined mainly by the plating, either gold, or nickel/gold. Therefore, in some cases consolidation of the silver base pattern may be omitted. This is an important advantage for some device processing sequences. Whereas it is preferred that the source/drain electrodes, made according to the invention, be applied before the semiconductor layer, this preferred sequence is dictated by the need to heat the substrate substantially to consolidate the silver base pattern. Processes where no consolidation is used, or only modest heating to achieve partial consolidation, allow the added flexibility of forming the semiconductor layer at any stage in the process. For example, an alternative is a conventional MOS transistor structure in which the organic semiconductor is the substrate, the source and drain electrodes are applied to the organic semiconductor substrate, the gate dielectric is formed on the organic semiconductor substrate, and then the gate electrode is formed. Another alternative transistor structure for a TFT device is a modified form of J-FET with n-type and p-type layers together forming a p-n junction. A gate controls the pinch-off of the channel between source and drain. Yet another option is the lamination approach wherein two substrates are prepared, one containing, for example, the interconnection metallization, and the source/drain electrodes, and the other having the semiconductor, gate dielectric, and gate. The two substrates are laminated together. Other laminate choices may be used. The choice of where to divide the structure to produce the laminates may be influenced by the processing conditions. As stated above, in some cases it may not be necessary to heat the MOD material severely during the consolidation step. In that case the choice of device elements on the two polymer laminates is relatively unconstrained. More likely, however, the source and drain contacts will be formed on one substrate and the semiconductor layer on the other. This allows substantial heating of the polymer substrate that contains the source drain for the consolidation step, without impairment of the semiconductor layer. For example, the structure shown in FIG. 16 may comprise one laminate, and the layers formed in FIGS. 17–20 deposited in reverse order on another, compatible, polymer substrate. The two substrates are then laminated together using known techniques. See for example, U.S. Pat. No. 6,197,663 issued Mar. 6, 2001, which is incorporated herein by reference.

Referring to FIG. 20, width $d_1$ is intended to represent the approximate minimum design rule for the MOD technology used to form the base contacts 82, 83. The minimum design rule is shown for both the channel length and the source/drain conductor width. There are at least two potential goals with respect to dimension $d_1$, the overall size of the transistor, and the channel length. The primary goal of this aspect of the invention is to minimize the channel length, therefore the spacing between the source and drain is preferably set at the minimum design rule $d_1$. To reach both the primary goal and the secondary goal, all three dimensions indicated in FIG. 20 should be met. Focusing on the primary goal, and with reference to FIG. 22, it is evident that, due to the thickness of layers 84 and 85, the final distance separating the source and drain electrodes is $d_2$, where $d_2$ is substantially less than $d_1$. Therefore, using this aspect of the invention allows the channel length dimension to be formed even smaller than the chosen patterning technique allows. As an example, if the minimum source/drain conductor width, and the minimum source/drain electrode spacing, that can be printed reliably with the MOD deposition technique is 10 microns, and the thickness of the plating layers 84 and 85 are each 1 micron, the channel length may be reduced, using the method of the invention, by 40%. A corresponding improvement in the high frequency performance of the TFT may be expected.

It will also occur to those skilled in the art that an equivalent approach may use a dimension for the source/drain spacing in the base pattern that is not actually at the minimum design rule and still achieve the goal cited. For example, if in the above case the initial source drain spacing in the base pattern is 12 microns, larger than the minimum design rule, the final channel length after plating will be 8 microns, still below the minimum design rule. This equivalent is to be considered covered by the term "approximately equal" to the minimum design rule.

Figure 23:
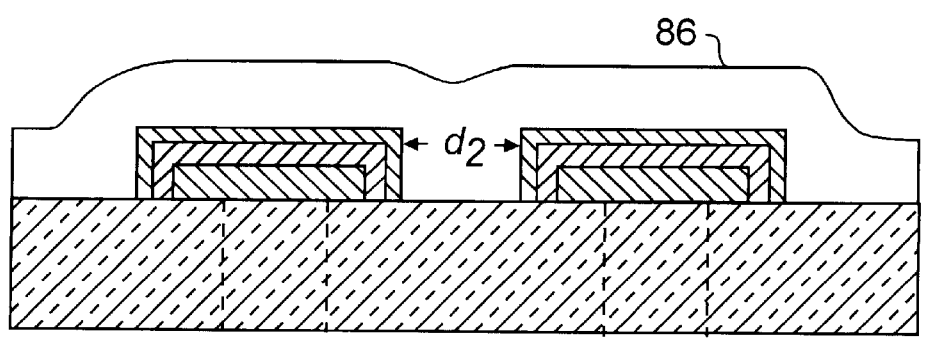

The last step shown in the sequence represented by FIGS. 20–23 is the deposition of the organic semiconductor layer 86 in FIG. 23. The thickness of layer 86 is relatively unimportant as long as it extends between the source/drain electrodes and covers the substrate between them. The sequence of process steps shown in these figures is chosen for illustration because it is the preferred sequence for avoiding deterioration of the relatively sensitive polymer semiconductor due to subsequent processing. The most severe of these is the heating step to consolidate the MOD base pattern. However, if, as indicated above, the heating step is omitted, or a more moderate heating step than otherwise required is used, then the polymer semiconductor may be applied earlier in the process. It is expected that conventional polymer semiconductor materials will easily survive the plating steps used to plate the source/drain electrodes according to the invention.

The process sequence shown above for making the CMOS inverter circuit has three metal levels, partly to show the potential of the process for making more complex circuits. It will be evident to those skilled in the art that the simple inverter of FIG. 1 can be made with two levels of interconnect if the n- and p-devices are properly arranged for negative and positive supply busses on the same level.

As known by those skilled in the art, the nickel layer described at several places above, when formed by electroless plating, is typically a Ni alloy, preferably an alloy of phosphorus. Reference to nickel layers herein, and in the appended claims, is intended to refer to this form of nickel.

In the methods described herein the MOD deposited base pattern comprises silver particulates. Alternatively, copper particulates may be used. Essentially the same procedures as described for silver will be suitable for copper MOD base patterns. In the case of copper base patterns, the nickel intermediate layer is recommended as a buffer between the copper in the base pattern and the gold in the gold plated layer.

Various additional modifications of this invention will occur to those skilled in the art. All deviations from the specific teachings of this specification that basically rely on the principles and their equivalents through which the art has been advanced are properly considered within the scope of the invention as described and claimed.

We claim:

1. A method for manufacturing an integrated circuit thin film transistor device comprising:
   a. preparing a substrate, the substrate comprising an organic semiconductor material,
   b. forming a plurality of field effect thin film transistors on the substrate, the plurality of thin film field effect transistors made by the steps comprising:
      1. forming a source contact on the substrate,
      2. forming a drain contact on the substrate and spaced from the source electrode leaving a channel location therebetween, 3. depositing a dielectric layer covering both the source contact and the drain contact, and
4. forming a gate electrode overlying the channel location, the invention characterized in that the source and drain contacts are formed by the steps of:
   i. forming a base pattern to define the area of the source and drain contacts, the base pattern formed by depositing a mixture of metal particulates, a MOD material, and a carrier, and
   ii. depositing a layer of gold on the base pattern.

2. The method of claim 1 wherein the metal particulates comprise silver particulates.

3. The method of claim 2 wherein an intermediate layer of nickel is deposited on the base pattern prior to depositing the layer of gold.

4. The method of claim 1 wherein the base pattern is not heated between steps i. and ii.

5. The method of claim 1 wherein the base pattern is deposited by a process having a minimum line width d, and the source and drain contact areas are spaced apart by a distance approximately equal to d.

6. The method of claim 1 wherein the base pattern is printed.

7. The method of claim 6 wherein the base pattern is formed electrographically.

8. A method for the manufacture of an integrated circuit thin film transistor device comprising forming a plurality of thin film field effect transistors on an insulating substrate, the plurality of thin film field effect transistors made by the steps of:
   a. forming a field effect transistor gate,
   b. forming a gate dielectric layer over the field effect transistor gate,
   c. forming a source contact and a drain contact on the gate dielectric layer by steps comprising:
      i. forming a base pattern to define the areas of the source and drain contacts, and the base pattern formed by depositing a mixture of metal particulates, a MOD material, and a carrier, and
      ii. depositing a layer of gold on the base pattern,
   e. forming an organic semiconductor layer between the source and drain contacts.

9. The method of claim 8 wherein the metal particulates comprise silver particulates.

10. The method of claim 8 wherein an intermediate layer of nickel is formed between the base pattern and the layer of gold.

11. The method of claim 8 wherein after step c. i. the base pattern is heated to consolidate the metal particulates.

12. The method of claim 8 wherein the base pattern is not heated between steps c. i. and c. ii.

13. The method of claim 8 wherein the base pattern is deposited by a process having a minimum line width d, and the source and drain contact areas are spaced apart by a distance approximately equal to d.

14. The method of claim 8 wherein the base pattern is printed.

15. The method of claim 14 wherein the base pattern is formed electrographically.

16. A method for the manufacture of an integrated circuit thin film transistor device comprising forming a plurality of thin film field effect transistors on an insulating layer, said plurality of thin film field effect transistors comprising a source contact, a drain contact, a gate electrode, and an organic semiconductor active layer, said source and drain contacts made by the steps of:
   a. forming a base pattern to define the areas of the source and drain contacts, the base pattern formed by depositing a mixture of metal particulates, a MOD material, and a carrier,
   b. depositing a layer of gold on the base pattern.

17. The method of claim 16 wherein the base pattern is printed.

18. The method of claim 17 wherein the base pattern is formed electrographically.

19. The method of claim 16 wherein the source and drain contacts are formed on a first polymer substrate and the gate electrode and the organic semiconductor active layer are formed on a second polymer substrate and the method further comprises the step of laminating the first and second substrates together.

* * * * *